US010615190B2

(12) United States Patent
Ebihara (10) Patent No.: US 10,615,190 B2
(45) Date of Patent: Apr. 7, 2020

(54) DUAL CONVERSION GAIN HIGH DYNAMIC RANGE READOUT FOR COMPARATOR OF DOUBLE RAMP ANALOG TO DIGITAL CONVERTER

(71) Applicant: OMNIVISION TECHNOLOGIES, INC., Santa Clara, CA (US)

(72) Inventor: Hiroaki Ebihara, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/540,706

(22) Filed: Aug. 14, 2019

(65) Prior Publication Data

US 2019/0371828 A1 Dec. 5, 2019

Related U.S. Application Data

(62) Division of application No. 15/486,896, filed on Apr. 13, 2017, now Pat. No. 10,431,608.

(51) Int. Cl.
*H01L 27/12* (2006.01)
*H04N 5/378* (2011.01)

(52) U.S. Cl.
CPC ......... *H01L 27/1255* (2013.01); *H04N 5/378* (2013.01)

(58) Field of Classification Search
CPC .......... H03M 1/85; H03M 1/361; H03M 1/56; H03M 1/185; H01L 27/1255;
(Continued)

(56) References Cited

U.S. PATENT DOCUMENTS 5,589,785 A * 12/1996 Garavan ................. H03F 1/303
327/563
6,970,022 B1 * 11/2005 Miller ................... H03K 3/3565
327/205
(Continued)

FOREIGN PATENT DOCUMENTS

TW 2008/12220 3/2008

OTHER PUBLICATIONS

ROC (Taiwan) Patent Application No. 107110406—Taiwanese Office Action and English Translation dated Feb. 25, 2019, 26 pages.

*Primary Examiner* — Antoinette T Spinks
(74) *Attorney, Agent, or Firm* — Christensen O'Connor; Johnson Kindness PLLC (57) ABSTRACT

A method includes coupling a low gain input of a dual stage comparator to establish a low conversion gain mode. An analog-to-digital (ADC) operation is performed to determine a low gain reset voltage. A low gain input is decoupled in response to a DCG control signal. A high gain input is coupled to establish a high conversion gain mode in response to the DCG control signal. The ADC operation is performed with the high gain input to determine a high gain reset voltage. The ADC operation is performed with the high gain input to determine a high gain signal voltage. The high gain input is decoupled in response to a DCG control signal transition. The low gain input is recoupled in response to the DCG control signal, and the ADC operation is performed with the low gain input to determine a low gain signal voltage.

7 Claims, 5 Drawing Sheets

(58) Field of Classification Search
CPC ........ H04N 5/378; H04N 5/374; H04N 5/335; H04N 5/27452
See application file for complete search history.

(56) References Cited

U.S. PATENT DOCUMENTS

| | | | |
|---|---|---|---|
| 8,767,106 B2* | 7/2014 | Ueno | H03F 3/72 250/208.1 |
| 9,041,581 B2* | 5/2015 | Wolfs | H03M 1/185 341/159 |
| 9,288,417 B2* | 3/2016 | Tanaka | H04N 5/335 |
| 9,967,505 B1* | 5/2018 | Ebihara | H04N 5/378 |
| 2003/0001625 A1* | 1/2003 | Jaussi | H03K 3/35613 327/65 |
| 2011/0279718 A1* | 11/2011 | Yoo | H03F 3/45188 348/300 |
| 2015/0172580 A1 | 6/2015 | Zhang | |
| 2015/0229321 A1 | 8/2015 | Lin | |

* cited by examiner

DUAL CONVERSION GAIN HIGH DYNAMIC RANGE READOUT FOR COMPARATOR OF DOUBLE RAMP ANALOG TO DIGITAL CONVERTER

REFERENCE TO RELATED APPLICATIONS

The present application is a divisional of U.S. patent application Ser. No. 15/486,896, filed Apr. 13, 2017, now pending. U.S. patent application Ser. No. 15/486,896 is hereby incorporated by reference.

TECHNICAL FIELD

This disclosure relates generally to image sensors, and in particular but not exclusively, relates to dual conversion gain for high dynamic range image sensors.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

Image sensors may implement dual conversion gain to obtain high dynamic range. The high dynamic range may be obtained by reading from pixels under low gain, then high gain, and then combining the two readouts. However, there may be a large difference in a reset level of the pixels in high and low conversion gain modes. While the difference in reset level may be compensated for using two comparators, the area for the comparator is doubled by having two comparators. Another way is to have two set of input stages of the comparator but parasitic capacitances within the comparators may affect frame rate, for example. Many techniques have been employed to mitigate these effects, but some of these methods may not entirely eliminate the effects.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for an image sensor with a two-input dual stage comparator for dual conversion gain high dynamic range operation are described herein. In the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Figure 1A:
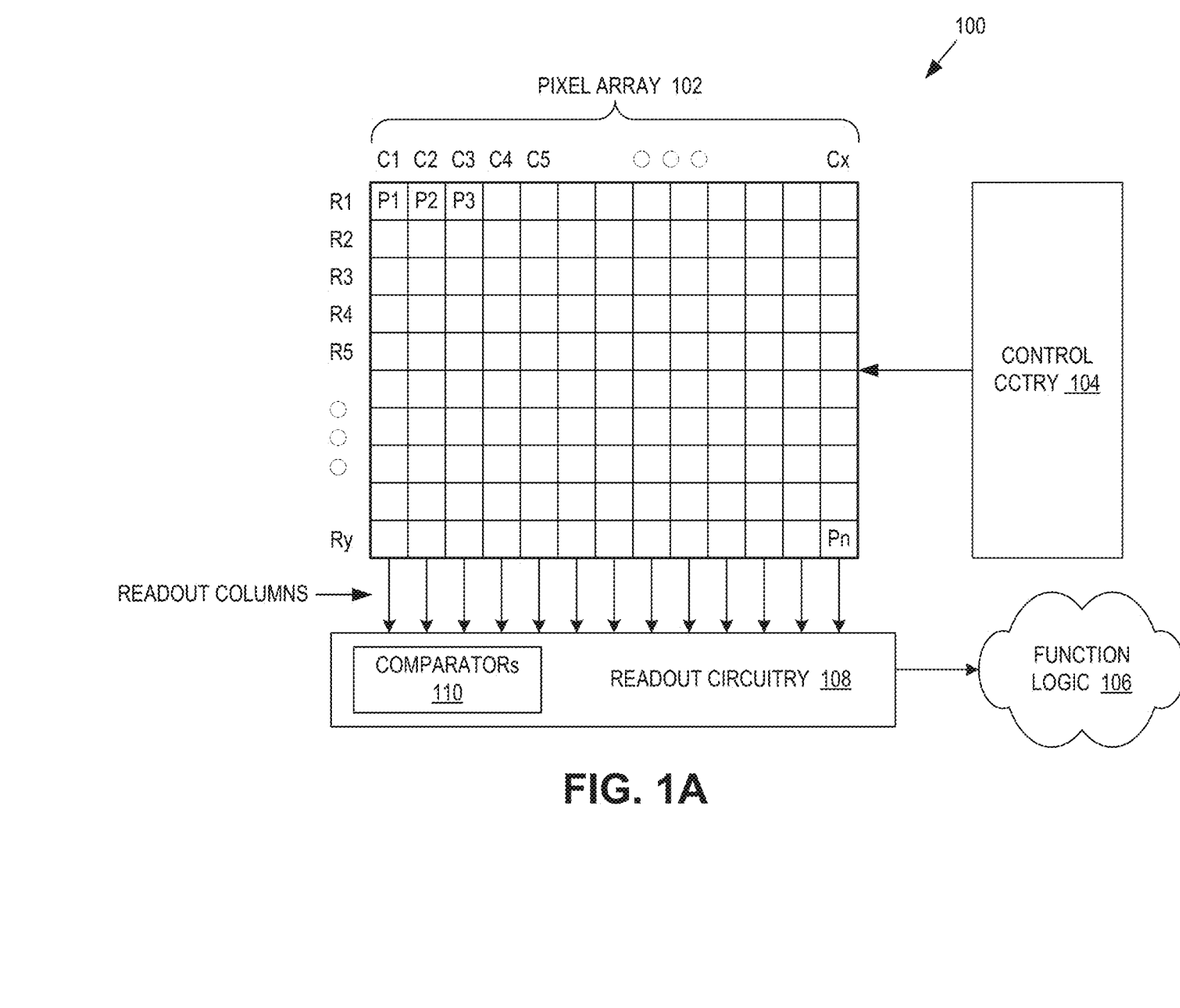
FIG. 1A illustrates one example of an imaging system in accordance with an embodiment of the present disclosure.

FIG. 1A illustrates one example of an imaging system 100 in accordance with an embodiment of the present disclosure. Imaging system 100 includes pixel array 102, control circuitry 104, readout circuitry 108, and function logic 106. In one example, pixel array 102 is a two-dimensional (2D) array of photodiodes, or image sensor pixels (e.g., pixels P1, P2 . . . , Pn). As illustrated, pixels are arranged into rows (e.g., rows R1 to Ry) and columns (e.g., column C1 to Cx) to acquire image data of a person, place, object, etc., which can then be used to render a 2D image of the person, place, object, etc. However, pixels do not have to be arranged into rows and columns and may take other configurations.

Figure 1B:
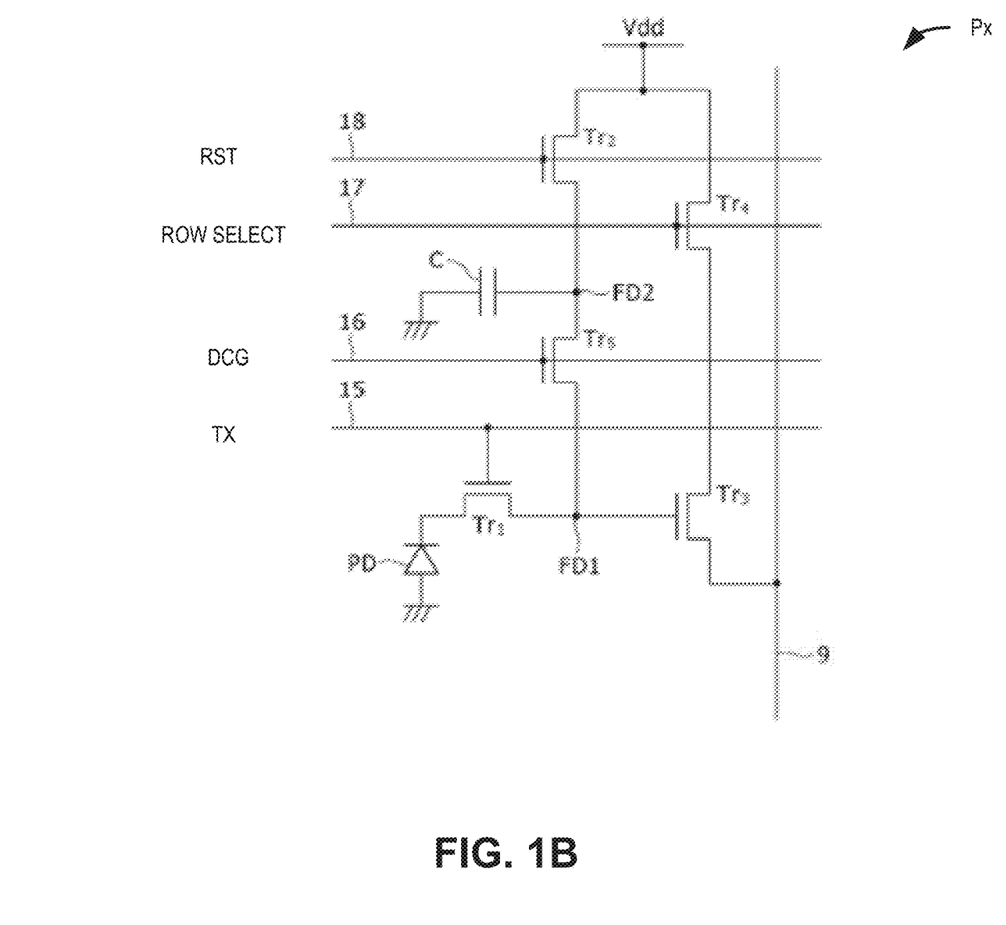
FIG. 1B is an example schematic of a pixel in accordance with an embodiment of the present disclosure.

FIG. 1B is an example schematic of a pixel Px in accordance with an embodiment of the present disclosure. Pixel Px may be one example of the pixels of the array 102, and may be configured for dual conversion gain (DCG) operation. The DCG operation may provide high dynamic range (HDR), for example. The illustrated embodiment of pixel Px includes a photodiode (PD), first and second floating diffusions (FD1 and FD2), a capacitor C, reset gate Tr2, row select gate Tr4, DCG gate Tr5, source follower transistor Tr3, and transfer gate Tr1. The components labeled as "gate" may be transistors, for example.

The reset transistor Tr2 may be controlled by a RST control signal provided to a gate electrode of Tr2. Other control signals such as ROW SELECT, DCG, and TX may be similarly provided to a gate electrode of Tr43, Tr5, and Tr1, respectively. The various control signals may be provided by control circuitry 104 to control the operation of the pixel Px in order to reset the pixel and to readout signal voltage, e.g., image data. In some embodiments, image charge photogenerated by the PD may be transferred to FD1 or both of FD1 and FD2 depending on a conversion gain mode—a high conversion gain mode or a low conversion gain mode, which may generate a voltage on floating diffusion FD1. The voltage on the floating diffusion FD1 may be readout though bit line 9. For example, during a high conversion gain mode, image charge may be transferred only to FD1 and generate some voltage difference in FD1 which is readout via bitline 9. Conversely, during a low conversion gain mode, image charge may be transferred to both of FD1 and FD2 and generate smaller difference in voltage on FD1 compared with the case of high conversion gain mode and the voltage difference may be readout via bitline 9. As such, the control signal DCG may change depending on whether the high conversion gain mode or the low conversion gain mode is desired. Additionally, the DCG signal may be changed during image data readout form each pixel to obtain both the high conversion gain mode image data and low conversion gain mode image data, which may be subsequently combined for HDR operations. Additional operational details will be discussed below with regards to FIG. 3.

Returning to FIG. 1A, in one example, after each image sensor photodiode/pixel in pixel array 102 has acquired its image data or image charge, the image data is readout by readout circuitry 108 and then transferred to function logic 106. Readout circuitry 108 may be coupled to readout image data from the plurality of photodiodes in pixel array 102. In various examples, readout circuitry 108 may include amplification circuitry, analog-to-digital (ADC) conversion circuitry, or otherwise. In some embodiments, one or more comparators 110 may be included for each of the readout columns. The one or more comparators 110 may be included in a respective analog-to-digital converter (ADC) included in the readout circuitry 108, for example. Function logic 106 may simply store the image data or even manipulate the image data by applying post image effects (e.g., crop, rotate, remove red eye, adjust brightness, adjust contrast, or otherwise). In one example, readout circuitry 108 may readout a row of image data at a time along readout column lines (illustrated) or may readout the image data using a variety of other techniques (not illustrated), such as a serial readout or a full parallel readout of all pixels simultaneously.

In some embodiments, each of the comparators 110 may include two input circuits. For example, one input circuit may be used during a high conversion gain mode, and the other input circuit may be used during a low conversion gain mode. In some embodiments, each comparator 110 may be a dual-stage comparator and further include cascode devices in a first stage. Additionally, the two input circuits may be selectively coupled/decoupled from the shared cascode devices and the second stage. Additionally, a physical layout of the comparators 110 may have both input stages arranged adjacent to a current source, which is then arranged adjacent to the cascode devices. The cascode devices may be arranged next to a current mirror, which is adjacent to the second stage. Arranging the layout so that the cascode devices are adjacent to the current mirror and the second stage may allow for a reduction in parasitic capacitance of output of the first stage. Reducing parasitic capacitance may allow for faster ADC operations, which may result in faster frame rates for the imaging system 100.

In some embodiments, an order the pixels are reset and readout from may be ordered based on the two conversion gain modes and the associated inputs of the comparators 110. For example, the pixels may be reset in a low conversion gain mode before being reset in the high gain mode. Subsequently, and while still in the high conversion gain mode, the high conversion gain mode signal may be readout and an ADC operation may be performed before the same is done for the low conversion gain mode. During the reset and signal readout, control signals may simultaneously control the various gates of the pixels and control the inputs of the comparators 110.

In one example, control circuitry 104 is coupled to pixel array 102 to control operation of the plurality of photodiodes in pixel array 102. For example, control circuitry 104 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 100 may be included in a digital camera, cell phone, laptop computer, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2:
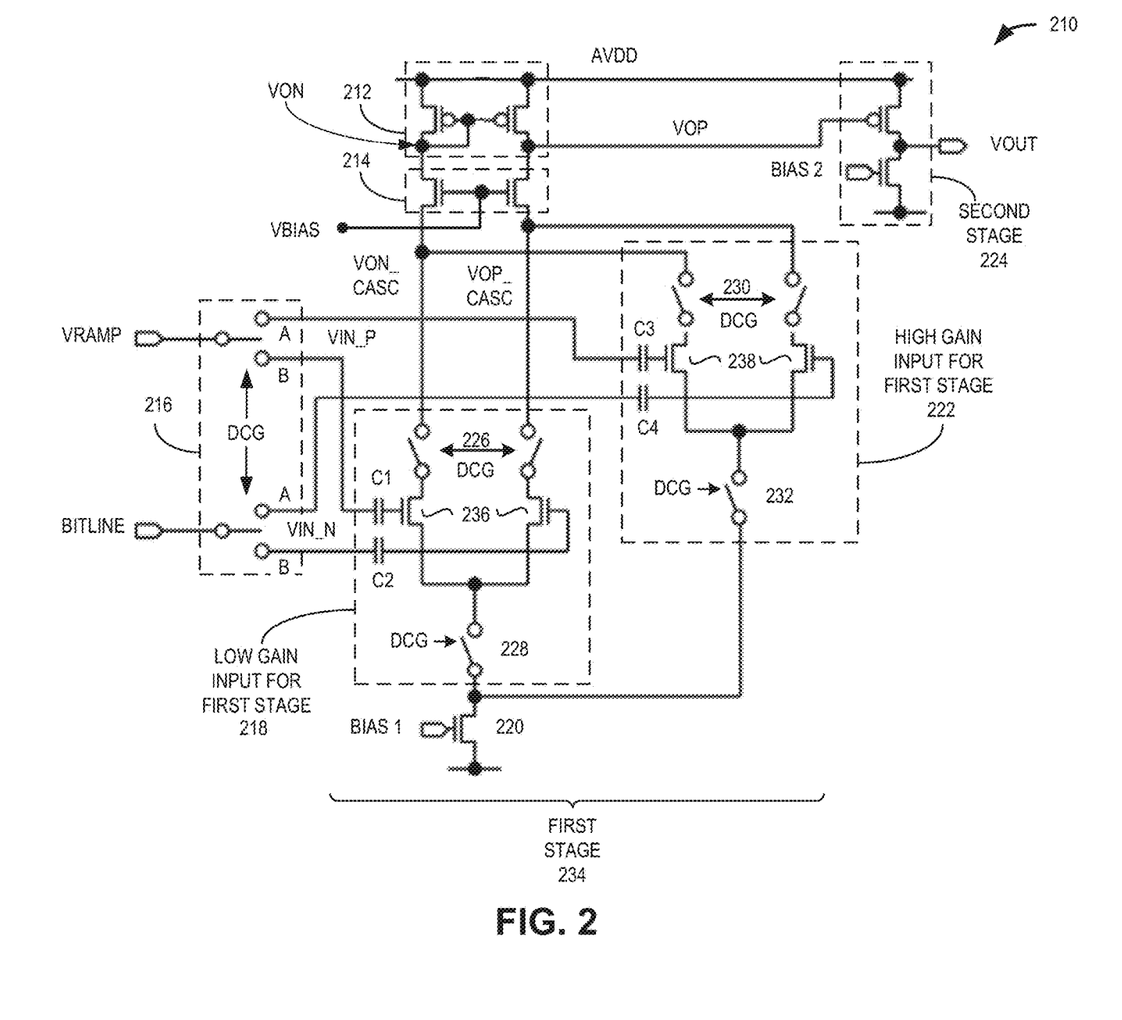
FIG. 2 is a comparator in accordance with an embodiment of the present disclosure.

FIG. 2 is a comparator 210 in accordance with an embodiment of the present disclosure. The comparator 210 may be an example of one of the comparators 110. The comparator 210 may provide an output signal in response to a comparison of an image charge signal received on the bitline input to a reference voltage signal VRAMP received on the VRAMP input. The output signal may provide a digital representation of the received image charge signal, for example. In some embodiments, the comparator 210 may be included in an analog-to-digital converter (ADC). Additionally, the comparator 210 may include two input circuits, with each one associated with a different gain mode for DCG operation. For example, a high gain input may be used when in a high conversion gain mode, and a low gain input may be used when in a low conversion gain mode. Further, the comparator 210 may be a dual stage comparator with the two input circuits associated with a first of two stages.

The illustrated embodiment of the comparator 210 includes a first stage 234 and a second stage 224. The first stage 234 may be coupled to receive the image charge voltage signal on the BITLINE input and further coupled to receive VRAMP on the VRAMP input, e.g., the reference voltage input. The first stage 234 may provide a first output VOP to the second stage 224, which, in response, may provide a second output VOUT. The first stage 234 may be biased to flip, e.g., change the level of VOP, based on a comparison between VRAMP and the image charge voltage signal on the bitline input. BIAS2 may be chosen to make a set point, e.g., flipping point of second stage around the VOP voltage when the first stage is reset.

The illustrated embodiment of the first stage 234 includes PMOS current mirror 212, cascode devices 214, low gain input 218, NMOS tail transistor 220, and high gain input 222. The low gain input 218 and the high gain input 222 may include input capacitors C1, C2 and C3, C4, respectively. Additionally, the low gain input 218 and the high gain input 222 include input NMOS transistors 236 and 238, respectively. Both the low gain input 218 and the high gain input 222 may be selectively coupled to the inputs BITLINE and VRAMP via switches 216. The switches 216 may be controlled via a DCG control signal. For example, when an image system is in a low conversion gain mode, the DCG control signal may cause the switches 216 to couple the inputs to the low gain input 218, and conversely for a high conversion gain mode. Additionally, the low gain input 218 and the high gain input 222 may be selectively coupled to the tail bias transistor 228 through switches 228 and 232, respectively. The tail bias transistor 228 may receive a control signal BIAS 1 to couple the comparator 210 to a reference voltage, which may enable the comparator 210. Further, the low gain input 218 and the high gain input 222 may be selectively coupled to the cascode devices 214 via switches 226 and 230, respectively. Similar to the switches 216, the switches 226, 228, 230, and 232 may be controlled by the DCG control signal. In some embodiments, the DCG control signal(s) provided to the switches 216, 226, 228, 230, and 232 may be sequenced in a manner to maintain stability of the current source supply provided to the functional areas of the first and second stages, and to further limit or prevent current surges through the comparator 210.

The PMOS current mirror 212 may include two PMOS transistors coupled together at their gates and coupled in parallel between a high reference voltage denoted as AVDD and nodes VON and VOP. Further, gates of the PMOS current mirror 212 transistors may be coupled to the node VON. The cascode devices 214 may be coupled between the nodes VON and VOP and nodes VON_CASC and VOP_CASC. For example, the cascode devices 214 includes two NMOS transistors coupled between nodes VON and VON_CASC and VOP and VOP_CASC. The gates of the transistors may be coupled to a bias voltage VBIAS, which may keep the NMOS transistors operating in saturation region at around flipping point of the second stage 224.

The NMOS input transistors 236 and 238 may be coupled to receive VRAMP and the image charge voltage signal on BITLINE when their respective input circuits are coupled accordingly. The first stage 234 may change a value of VOP based on a comparison of the image charge voltage signal on the BITLINE input to VRAMP during an ADC operation. VOP may be provided to the second stage 226 as an intermediate voltage.

The illustrated embodiment of the second stage 224 includes an input PMOS transistor, a current source transistor. The PMOS transistor may receive an input to the second stage, and may be coupled to receive the intermediate voltage VOP from the first stage 234. The current source transistor may be coupled to receive an reference bias voltage BIAS 2. The output VOUT of the comparator 210 may be provided by the second stage 224.

Figure 3:
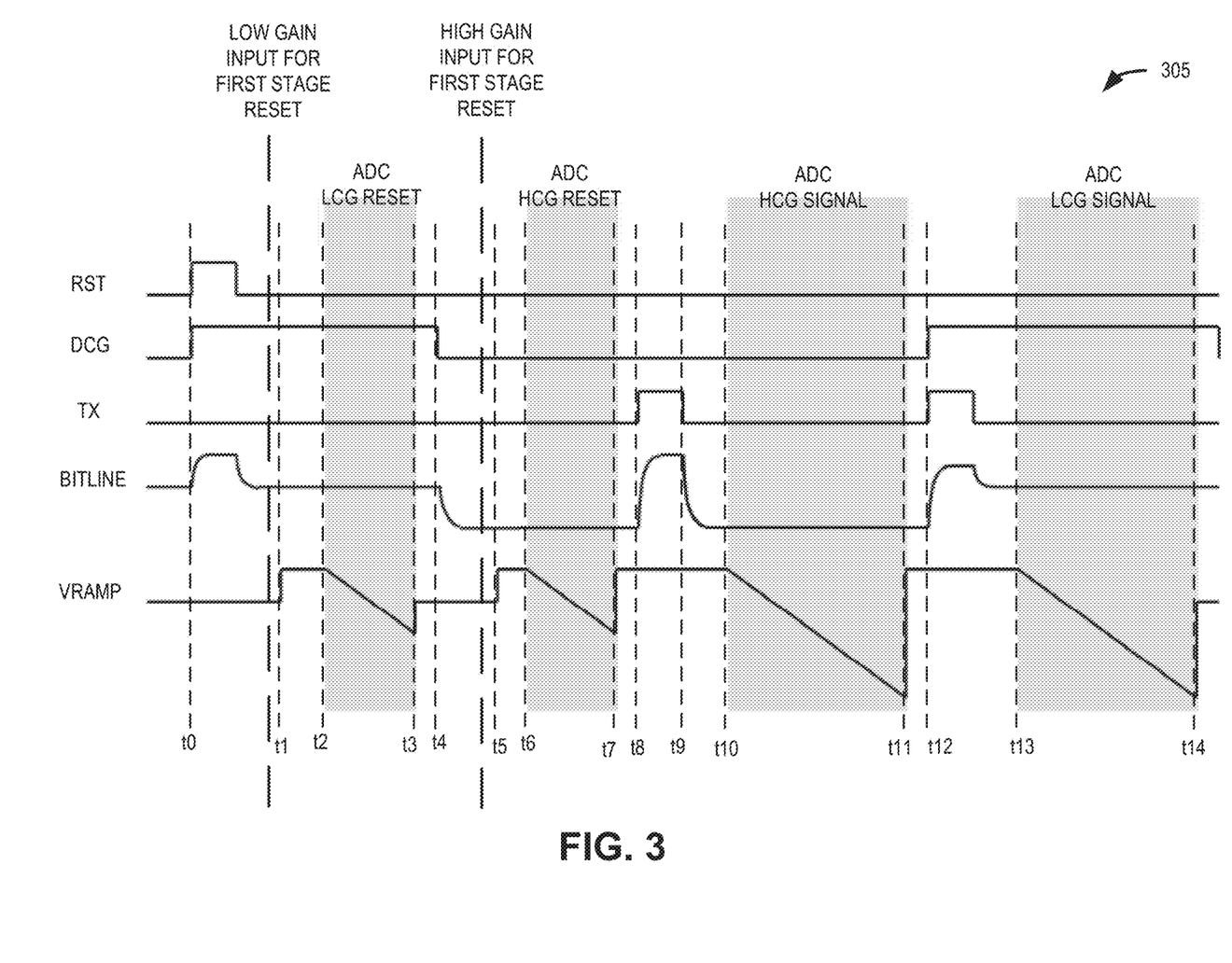
FIG. 3 is a timing diagram in accordance with an embodiment of the present disclosure.

FIG. 3 is a timing diagram 305 in accordance with an embodiment of the present disclosure. The timing diagram 305 will be used to illustrate operation of the comparator 210 and the pixel Px. The timing diagram 305 includes control signals that control operation of a pixel Px of the array 102, and control signals that control operation of the comparator 210 of readout circuitry 108. The comparator 210 may be coupled to the array 102 via the readout columns, for example. The control signals that control the pixel include RST, DCG and TX, and the control signals that control the comparator 210 is the DCG control signal. While the DCG control signal is depicted as a single control signal, in some embodiments, the DCG control signal includes a plurality of control signals that may be sequenced to separately control the various functional areas of the comparator 210 in a desired sequence. The desired sequence may be arranged to maintain current stability in the comparator 210, for example. The waveforms BITLINE and VRAMP show changes in voltage on respective inputs of the comparator 210, where the waveform on the BITLINE input represents image data received by the comparator 210 from the pixel Px. In general, the timing diagram 305 shows the sequence of determining reset and signal voltages for low conversion gain (LCG) and high conversion gain (HCG) modes that are combined to provide DCG-based image data. For example, reset voltages of LCG and HCG may be obtained in that order, then signal voltages of HCG and LCG may be obtained in that order.

At time t0, RST and DCG transition high. The combination of both RST and DCG being in a high state may cause the floating diffusions FD1 and FD2 to be reset to reference voltage Vdd by enabling Tr2 and Tr7. Additionally, during this time, and which is not shown in the timing diagram 305, the ROW SELECT signal may be high so that both FD1 and FD2 are coupled to the bitline 9 and, as a result, to the BITLINE input of the comparator 210. As such, resetting the pixel Px may cause the increase in the BITLINE waveform while RST is high. RST may transition low shortly thereafter, decoupling FD1 and FD2 from the reference voltage Vdd.

Further, the transition of DCG to high state may cause the low gain input 218 to be coupled to the inputs VRAMP and BITLINE, to be coupled to tail bias transistor 220, and further coupled to cascode devices 214. For example, switches 226 and 228 may be closed, and switches 216 may be coupled to B nodes. It should also be noted that when DCG is in the high state switches 230 and 232 may be open, which may decouple the high gain input 222 from the tail transistor 220 and the cascode devices 214, respectively. Because the switches 216 are coupled to the B nodes, the high gain input 222 may also be decoupled from the inputs.

At a time slightly before t1, the low gain input 218 may be reset to cancel the voltage offset for LCG mode on the BITLINE input so that voltage range of ADC for low conversion gain mode is adjusted to cover the signal for LCG mode.

At time t1, VRAMP may increase to prepare for an ADC operation to be performed beginning at time t2. The ADC operation that occurs from time t2 to time t3 may be to determine a baseline or reset of the pixel Px associated with the LCG mode—labeled ADC LCG RESET in timing diagram 305. The ADC LCG RESET may obtain the reset values of the Pixel Px when both floating diffusions FD1 and FD2 are coupled to the bitline 9 in response to the high state of the DCG signal. At time t2 the reference voltage VRAMP may slowly decrease to determine a voltage of BITLINE, e.g., the reset voltage of Px in the LCG mode. The decrease in VRAMP may end at time t3, at which time VRAMP may increase back to a default level.

At time t4, DCG may transition to a low state. In the low state, the transistor Tr5 may be turned "off" decoupling FD2 from FD1. Turning off Tr5 may result in the dip in the BITLINE voltage that occurs at time t4, which may be due to charge injection from channel to Tr5 and feed through from the gate to the source of Tr5. The charge injection and feed through may reduce the voltage on FD1, which is still coupled to the bitline 9. Additionally, the transition of DCG may reconfigure the comparator 210 to enable the high gain input 222 and disable the low gain input 218. For example, switches 226 and 228 may be opened to decouple the low gain input 218, and switches 230 and 232 may be closed to couple the high gain input 222. Further, switches 216 may transition from node B to node A to couple the high gain input 222 to the inputs VRAMP and BITLINE. At this time, the pixel Px is ready for an ADC HCG RESET operation, e.g., to determine the reset voltage in the HCG mode.

At a time slightly before t5, the high gain input 222 may be reset to cancel the voltage offset for HCG mode on the BITLINE input so that voltage range of ADC for high conversion gain mode is adjusted to cover the signal for HCG mode.

At time t5, VRAMP may increase again in preparation of another ADC operation. This time, however, the ADC operation is to determine a baseline or reset value for pixel Px during the HCG mode. At time t6, VRAMP may begin to decrease to perform an ADC operation to determine the reset voltage of pixel Px using the high gain input 222. The ADC operation may end at time t7, at which time VRAMP increases to prepare for an ADC operation using high gain on signal data, e.g., image data.

At time t8, control signal TX transitions high enabling transistor Tr1. Enabling the transfer gate, e.g., Tr1, couples the photodiode PD to the floating diffusion FD1. As a result, image charge establishes a voltage on FD1, which drives the source follower transistor Tr3. As a result, image data is provided to bitline 9 and, in turn, to the BITLINE input of the comparator 210. At time t10, an ADC operation using the high gain input 222 may be performed on the HCG mode image data. At time t11, the ADC operation completes and VRAMP is increased to prepare for a subsequent ADC operation.

At time t12, both the DCG and the TX control signal transition to the high state. As a result, the high gain input 222 may be decoupled and the low gain input is coupled in the comparator 210. Additionally, the transfer gate Tr1 is enabled as well as transistor Tr5 in the pixel Px. As such, both floating diffusions FD1 and FD2 are able to receive image charge from the PD. At time t13, an ADC operation may be performed on the LCG signal, which may end at time t14. Subsequently, the row select signal may switch to another row, and the process outlined by timing diagram 305 repeated.

Figure 4:
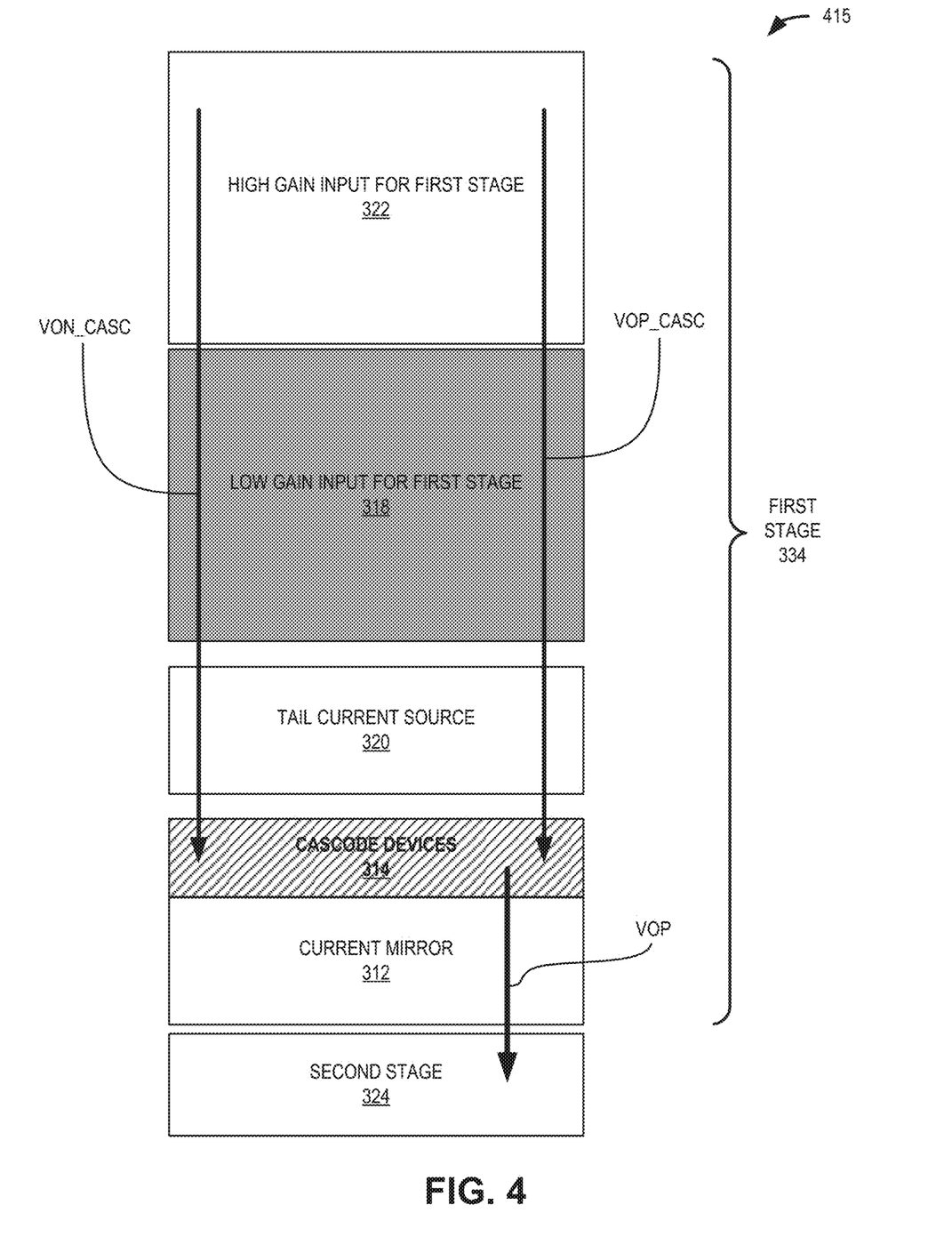
FIG. 4 is a layout of a comparator in accordance with an embodiment of the present disclosure.

FIG. 4 is a layout 415 of a comparator in accordance with an embodiment of the present disclosure. The layout 415 may be an example physical layout for the comparator 210, which may be formed on a semiconductor die as illustrated by the layout 415. The functional areas, or areas for short, shown in the layout 415 correspond to devices/components and/or combinations of devices/components of the comparator 210 including variations in doping, conductors, dielectrics, etc. By forming the areas of the comparator 210 as shown in the layout 415, certain electrical connections within the comparator 210 may be longer than others, which may affect their associated parasitic capacitances. By reducing some of the parasitic capacitances, the delay of the comparator can be reduced and a frame rate of the image sensor may be increased. For example, the arrow labeled VOP, which represents the conductive trace from the first stage 234 to the (input of the) second stage 224. VOP and VOP_CASC are separated by the cascode devices 214 so that the parasitic capacitance on the output of the first stage, VOP, can be reduced compared with the case there are no cascode devices. The capacitance on VOP influences much of the delay of the comparator 210, but the capacitance on VOP_CASC less effect. Without cascode device 214, the length of VOP is longer, equivalent as sum of VOP and VOP_CASC of FIG. 4 and so the capacitance on VOP is large. By having cascode devices 214, the length of VOP can be reduced and its parasitic capacitance may be reduced, which may reduce the delay of the comparator and increase the frame rate.

In the illustrated embodiment of the layout 415, the low gain input area 318 may include capacitors C1 and C2, two NMOS transistors, and switches 228 and 226. The area 318 represents all of the materials used in the semiconductor manufacturing to form the various components and their interconnects. The area 318 may be arranged adjacent to the high gain input area 322. The area 322 may likewise represent all of the manufacturing layers/materials used to form the various components of the circuitry forming the high gain input 322, such as C3, C4, two NMOS transistors, and switches 230 and 232.

The tail current source area 320 includes the NMOS transistor coupled to the reference voltage, and may be arranged between the low gain input area 318 and a cascode devices area 314. The tail current source can be arranged to adjacent to high gain input area, upper side of high gain input area in FIG. 4, instead. The cascode devices area 314 represents the two NMOS transistors that form the cascode devices. The cascode devices area 314 may be arranged adjacent to the current mirror area 312, which may be arranged next to the second stage 324. The various areas that form the second stage 324 are not depicted, but would include the PMOS input transistor and the NMOS tail bias transistor.

The arrows labeled VON_CASC and VOP_CASC represent conductive traces that couple the areas 318 and 322 to the tail current source area 320 and the cascode devices 314. While not shown, switches included in the areas 318 and 322 selectively couple/decouple their respective areas form the conductive traces in response to the DCG control signal. In some embodiments, the conductive traces may be disposed over/across/through the various interceding areas since the areas of the layout 415 are adjacently arranged.

Further, the arrow labeled VOP represents the conductive coupling of the first stage 334 to the second stage 324. By locating the cascode devices area 314 and the current mirror area 312 (where the output of the first stage 334 occurs at a node between the two areas 314 and 312) close to the second stage 324, the conductive coupling for VOP may be short. Having a short conductive coupling from the first stage 234 to the second stage 324 may reduce parasitic capacitance associated with the conductive coupling. The reduction in parasitic capacitance may reduce ADC and frame rate times.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A method comprising:
coupling a low gain input of a dual stage comparator to inputs and cascode devices to establish a low conversion gain mode in response to a dual conversion gain (DCG) control signal being in a first state;

performing an analog-to-digital (ADC) operation on a pixel with the low gain input to determine a low gain reset voltage of the pixel;

decoupling the low gain input in response to the DCG control signal transitioning to a second state;

coupling a high gain input of the dual stage comparator to the inputs and the cascode devices to establish a high conversion gain mode in response to the DCG control signal transitioning to the second state;

performing an ADC operation on the pixel with the high gain input to determine a high gain reset voltage of the pixel;

performing the ADC operation on the pixel with the high gain input to determine a high gain signal voltage of the pixel, wherein the signal voltage is due to image charge;

decoupling the high gain input in response to the DCG control signal transitioning to the first state;

recoupling the low gain input in response to the DCG control signal transitioning to the first state; and performing the ADC operation on the pixel with the low gain input to determine a low gain signal voltage of the pixel, wherein the signal voltage is due to image charge.

2. The method of claim 1, further comprising:

coupling first and second floating diffusions of the pixel to a high reference voltage in response to a reset control signal prior to performing the ADC operation on the pixel with the low gain input to determine a low gain reset voltage of the pixel.

3. The method of claim 1, further comprising:

coupling first and second floating diffusions to a bitline in response to the e DCG control being in the first state signal prior to performing the ADC operation on the pixel with the low gain input to determine the low gain reset voltage of the pixel.

4. The method of claim 3, further comprising:

decoupling the second floating diffusion from the bitline in response to the DCG control signal being in the second state prior to performing the ADC operation on the pixel with the high gain input to determine the high gain reset voltage of the pixel.

5. The method of claim 1, further comprising:

coupling first and second floating diffusions of the pixel to a photodiode of the pixel in response to a transfer control signal.

6. The method of claim 5, further comprising:

decoupling the first and second floating diffusions of the pixel from the photodiode of the pixel in response to a change in the transfer control signal prior to performing the ADC operation on the pixel with the high gain input to determine the high gain signal voltage of the pixel, wherein the first and second floating diffusions are coupled to a bitline.

7. The method of claim 6, further comprising:

decoupling the second floating diffusion from the bitline in response to the DCG control signal being in the first state prior to performing the ADC operation on the pixel with the low gain input to determine the low gain signal voltage of the pixel.

\* \* \* \* \*